(12) United States Patent
Lee et al.

(10) Patent No.: US 7,911,436 B2
(45) Date of Patent: Mar. 22, 2011

(54) SHIFT REGISTER AND DISPLAY DEVICE HAVING THE SAME

(75) Inventors: Hong-Woo Lee, Cheonan-si (KR); Kye-Hun Lee, Suwon-si (KR); Jong-Hwan Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 801 days.

(21) Appl. No.: 11/535,524

(22) Filed: Sep. 27, 2006

(65) Prior Publication Data

US 2007/0146289 A1  Jun. 28, 2007

(30) Foreign Application Priority Data

Sep. 27, 2005  (KR) .......................... 10-2005-0089827

(51) Int. Cl.
*G09G 3/36*  (2006.01)
*G11C 19/00*  (2006.01)
*H03K 19/01*  (2006.01)

(52) U.S. Cl. .............. 345/100; 345/98; 345/99; 377/64; 326/17

(58) Field of Classification Search ............ 345/98–100; 377/64–81; 326/17
See application file for complete search history.

(56) References Cited

U.S. PATENT DOCUMENTS

| 5,365,284 | A | * | 11/1994 | Matsumoto et al. | .......... | 348/793 |
| 5,694,061 | A | * | 12/1997 | Morosawa et al. | ........... | 326/119 |
| 5,994,155 | A | * | 11/1999 | Kim | ................................. | 438/30 |
| 6,583,777 | B2 | * | 6/2003 | Hebiguchi et al. | ............... | 345/92 |
| 7,256,759 | B2 | * | 8/2007 | Kim et al. | ......................... | 345/87 |
| 2005/0008114 | A1 | * | 1/2005 | Moon | ............................. | 377/64 |
| 2005/0264551 | A1 | * | 12/2005 | Hsieh et al. | .................... | 345/204 |

* cited by examiner

*Primary Examiner* — Sumati Lefkowitz
*Assistant Examiner* — David Tung
(74) *Attorney, Agent, or Firm* — Cantor Colburn LLP

(57) ABSTRACT

A shift register includes a plurality of stages connected to one another to sequentially generate output signals. Each of the stages has a plurality of output terminals, and each of the output terminals is connected to at least two gate lines and outputs a first output voltage alternately to the at least two gate lines to turn on thin film transistors.

15 Claims, 4 Drawing Sheets

SHIFT REGISTER AND DISPLAY DEVICE HAVING THE SAME

This application claims priority to Korean Patent Application No. 10-2005-0089827, filed on Sep. 27, 2005, and all the benefits accruing therefrom under 35 U.S.C. §119, the contents of which in its entirety are herein incorporated by reference.

BACKGROUND OF THE INVENTION (a) Field of the Invention

The present invention relates to a shift register and a display device having the same.

(b) Description of the Related Art

Liquid crystal displays are now widely used, as one of various flat panel displays. A liquid crystal display has two panels including field generating electrodes, such as pixel electrodes and a common electrode, and a liquid crystal layer interposed between the panels. The liquid crystal display applies voltages to the field generating electrodes to generate electric fields in the liquid crystal layer to determine the orientations of liquid crystal molecules of the liquid crystal layer, which in turn determine the polarization of incident light, thereby displaying images.

The liquid crystal display device further includes switching elements connected to the pixel electrodes, and a plurality of signals lines, such as gate lines and data lines that control the switching elements, which in apply voltages to the pixel electrodes.

The signal lines receive signals from separately provided driving devices and apply the signals to the pixels through the switching elements. Accordingly, in order to drive a display device, a driving device needs to be connected to the display device or mounted on the display device. However, the driving device increases manufacturing costs of the display device considerably.

BRIEF SUMMARY OF THE INVENTION

A shift register according to an exemplary embodiment of the present invention includes a plurality of stages which are connected to one another and sequentially generate output signals. Each of the stages has first and second output terminals to alternately output a first output voltage.

A display device according to an exemplary embodiment of the present invention includes: a substrate; a plurality of gate lines formed on the substrate; a plurality of data lines intersecting the gate lines; a plurality of thin film transistors connected to the gate lines and the data lines; a plurality of pixel electrodes connected to the thin film transistors and arranged in a matrix, each pixel electrode having a first edge parallel to the gate lines and a second edge shorter than the first edge and disposed adjacent to the first edge and parallel to the data lines; and a gate driver connected to the gate lines. The gate driver includes a plurality of stages which are coupled with one another configured to sequentially generate output signals, and each of the stages includes a plurality of output terminals. Each of the output terminals are connected to at least two gate lines configured to alternately output a first output voltage to the at least two gate lines to turn on the thin film transistors.

Each stage may include an output voltage generator configured to generate the first output voltage in response to an output start signal or the output signal of one of previous stages and generate a second output voltage different from or smaller than the first output voltage in response to the first output voltage of one of next stages.

Each of the stages may further include an output switching unit to output the first output voltage and the second output voltage alternately to the first output terminal and the second output terminal.

The output switching unit may include: a first transistor configured to switch the output of the output voltage generator according to a first switching signal, and a second transistor configured to switch the output of the output voltage generator according to a second switching signal.

The first switching signal and the second switching signal may have opposite phases.

The output switching unit may further include: a third transistor which passes or cuts off the second output voltage to the first output terminal according to the second switching signal, and a fourth transistor which passes or cuts off the second output voltage to the second output terminal according to the first switching signal.

The first and second switching signals may be reversed every 1 H period.

Two adjacent pixel electrodes in a column may be connected to different data lines.

The gate driver may include first and second shift registers connected to different gate lines, and each of the first and second shift registers may include first and second stages, respectively, of the plurality of stages.

BRIEF DESCRIPTION OF THE DRAWINGS

The accompanying drawings briefly described below illustrate exemplary embodiments of the present invention and, together with the detailed description, serve to explain the principles of the present invention in which.

DETAILED DESCRIPTION OF THE INVENTION

Figure 1:
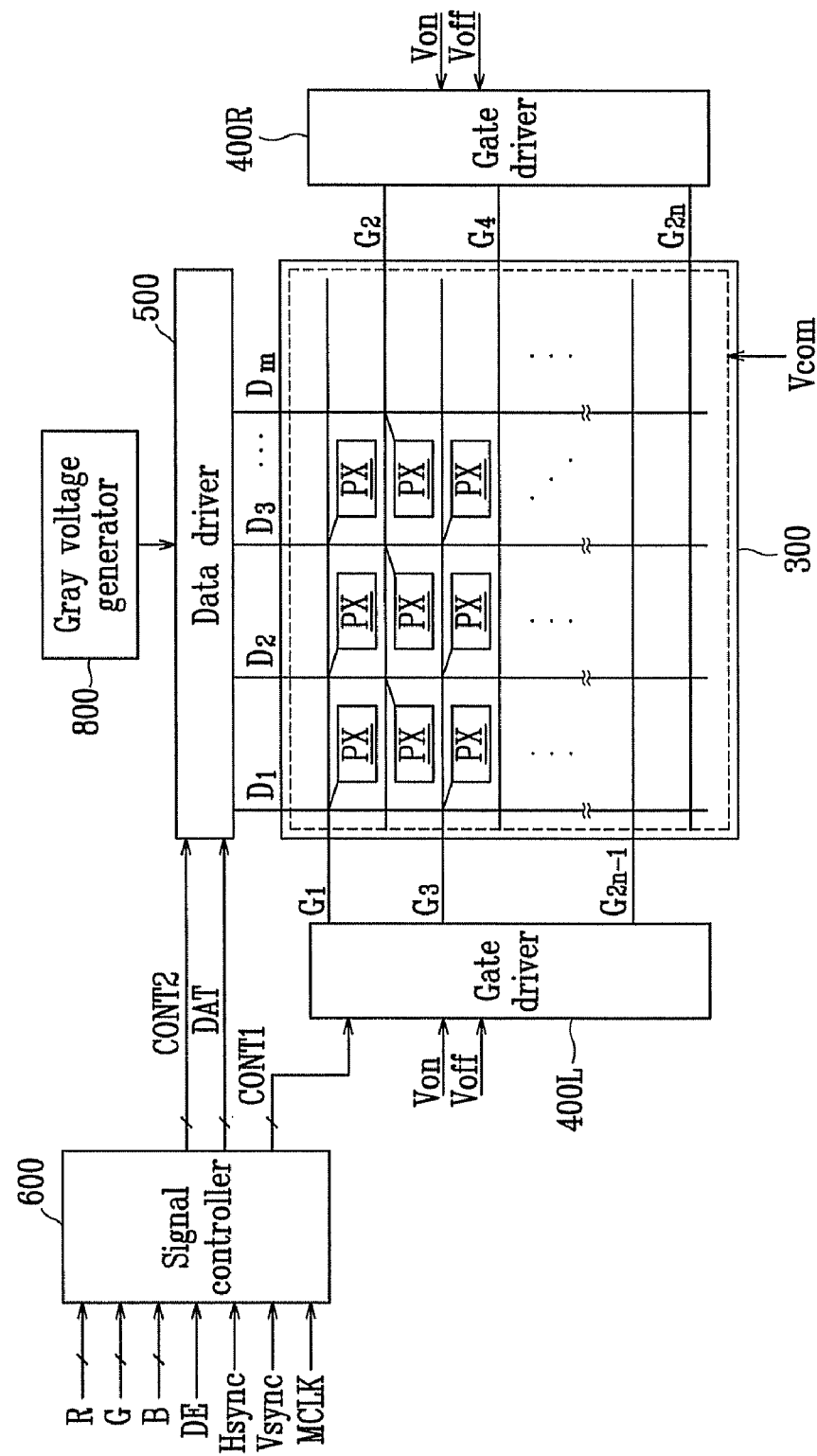
FIG. 1 is a block diagram of a liquid crystal display according to an exemplary embodiment of the present invention.

The present invention will now be described more fully hereinafter with reference to the accompanying drawings, in which exemplary embodiments of the present invention are shown. The present invention may, however, be embodied in many different forms and should not be construed as limited to the embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular exemplary embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, exemplary embodiments of the present invention should not be construed as being limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

A liquid crystal display according to an exemplary embodiment of the present invention will now be described as an example of a display device with reference to FIGS. 1 and 2.

FIG. 1 is a block diagram of a liquid crystal display according to an exemplary embodiment of the present invention. FIG. 2 is an equivalent circuit schematic diagram of one pixel in the liquid crystal display according to the exemplary embodiment of the present invention.

Figure 2:
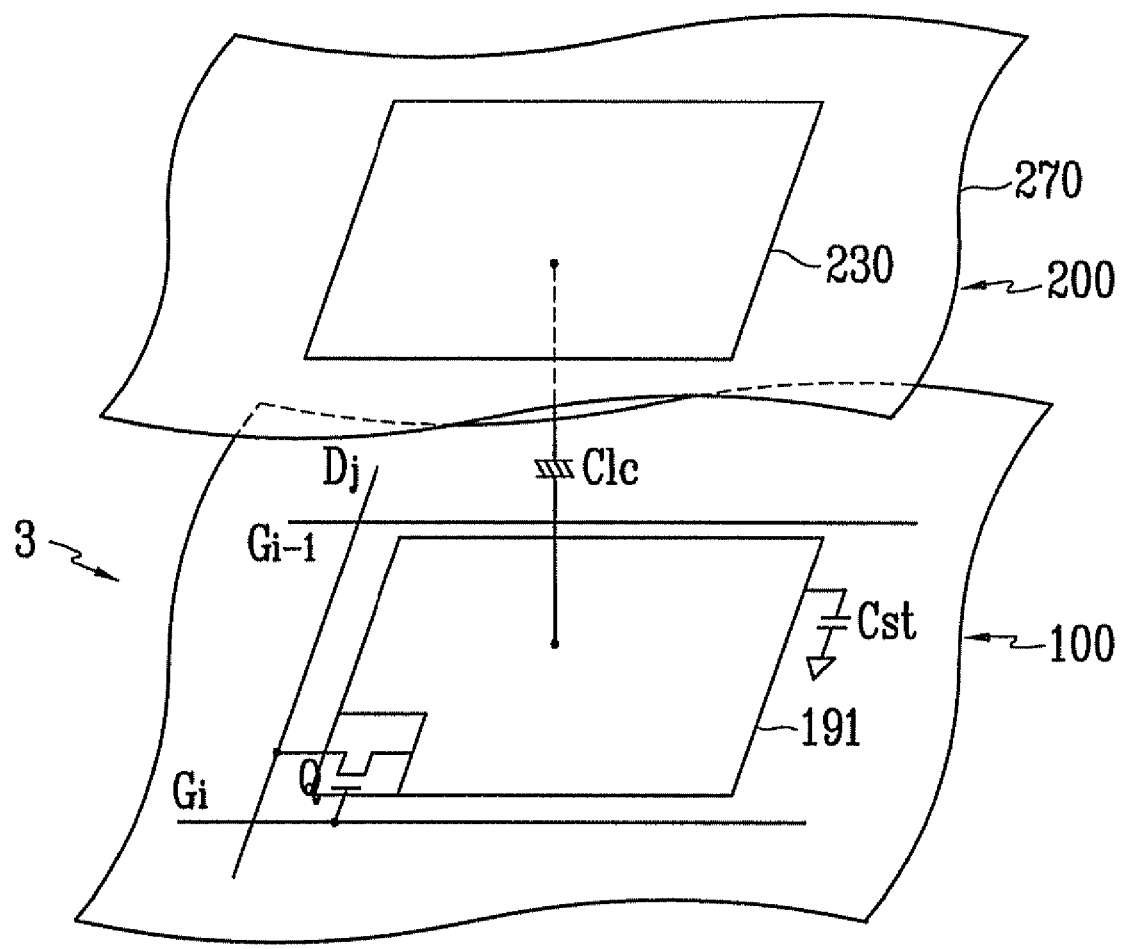
FIG. 2 is an equivalent circuit schematic diagram of one pixel in the liquid crystal display according to the exemplary embodiment of the present invention.

Referring to FIG. 1 and FIG. 2, the liquid crystal display according to the exemplary embodiment of the present invention includes a liquid crystal panel assembly 300, a pair of gate drivers 400L and 400R, a data driver 500, a gray voltage generator 800 and a signal controller 600.

In an equivalent circuit, the liquid crystal panel assembly 300 includes a plurality of display signal lines, and a plurality of pixels PX which are connected to the display signal lines and are arranged substantially in a matrix shape. In a structure shown in FIG. 2, the liquid crystal panel assembly 300 includes a lower panel 100, an upper panel 200 which faces the lower panel 100 and a liquid crystal layer 3 interposed between the panels 100 and 200.

The signal lines $G_1$ to $G_{2n}$ and $D_1$ to $D_m$ include a plurality of gate lines $G_1$ to $G_{2n}$ which transmit gate signals (also referred to as "scanning signals") and a plurality of data lines $D_1$ to $D_m$ which transmit data signals. The gate lines $G_1$ to $G_{2n}$ extend substantially in a row direction and substantially parallel to one another, and the data lines $D_1$ to $D_m$ extend substantially in a column direction and substantially parallel to one another.

Each pixel PX, for example a pixel PX connected to the i-th (where i=1, 2, . . . , n, . . . , and 2n) gate line $G_i$ and the j-th (where j=1, 2, . . . , and, m) data line $D_j$, includes a switching element Q connected to the signal lines $G_i$ and $D_j$, and a liquid crystal capacitor Clc and a storage capacitor Cst which are connected to the switching element Q. Referring to FIG. 1, two pixels PX adjacent in a column may be connected to different data lines $D_1$ to $D_m$ as illustrated.

The switching element Q is a three-terminal element, such as a thin film transistor, provided at the lower panel 100. The switching element Q has a control terminal connected to the gate line $G_i$, an input terminal connected to the data line $D_j$, and an output terminal connected to the liquid crystal capacitor Clc and the storage capacitor Cst.

The liquid crystal capacitor Clc has two terminals which include a pixel electrode 191 of the lower panel 100 and a common electrode 270 of the upper panel 200. The liquid crystal layer 3 interposed between the two electrodes 191 and 270 serves as a dielectric. The pixel electrode 191 is connected to the switching element Q, and the length of the pixel electrode 191 in the row direction is longer than that in the column direction like a pixel PX shown in FIG. 1. For example, the length of the pixel electrode 191 in the row direction is about three times that of a length of the pixel electrode 191 in the column direction (unlike that shown in FIG. 2). The common electrode 270 is formed on the entire surface of the upper panel 200, and a common voltage Vcom is applied to the common electrode 270. Unlike FIG. 2, the common electrode 270 may be provided on the lower panel 100. In this case, at least one of the two electrodes 191 and 270 can be formed in a linear shape or a bar shape.

The storage capacitor Cst, which assists the liquid crystal capacitor Clc, is formed by overlapping the pixel electrode 191 with a separate signal line (not shown), which is provided on the lower panel 100, along with an insulator interposed therebetween. A predetermined voltage, such as the common voltage Vcom, is applied to the separate signal line. Alternatively, the storage capacitor Cst may be formed by overlapping the pixel electrode 191 and a previous gate line $G_{i-1}$ through an insulator. The storage capacitor Cst may be omitted, if necessary.

In order to perform color display, each pixel PX uniquely represents one of the primary colors (i.e., spatial division), or each pixel PX sequentially represents the primary colors in turn (i.e., temporal division), such that spatial or temporal sums of the primary colors are recognized as a desired color. The primary colors may be, for example, red, green and blue.

FIG. 2 shows an example of a spatial division. In this example, each pixel PX has a color filter 230 that represents one of the primary colors in a region of the upper panel 200 corresponding to the pixel electrode 191. Unlike FIG. 2, the color filter 230 may be formed on or under the pixel electrode 191 of the lower panel 100. Referring to FIG. 1 again, the color filters 230 may be elongated in the row direction like the pixel electrodes 191. The color filters 230 in a row of pixels may represent the same primary color and may be connected to each other to form a stripe. In the column direction, the color filters 230 representing different primary colors are arranged in turn. In this case, three pixels PX adjacent in the column direction may form a dot that is a basic unit of an image.

At least one polarizer (not shown) is provided on the liquid crystal panel assembly 300.

Referring again to FIG. 1, the gray voltage generator 800 generates two sets of (reference) gray voltages related to transmittance of the pixels PX. One of the two sets of (reference) gray voltages has a positive value relative to the common voltage Vcom, and the other set has a negative value relative to the common voltage Vcom.

The gate drivers 400L and 400R may be disposed near left edges and right edges, respectively, of the liquid crystal ("LC") panel assembly 300. The left gate driver 400L may be connected to odd gate lines $G_1$, $G_3$, ... $G_{2n-1}$ and the right gate driver 400R may be connected to even gate lines $G_2$, $G_4$, ... $G_{2n}$. The gate drivers 400L and 400R apply gate signals, which are a combination of a gate-on voltage Von and a gate-off voltage Voff, to the gate lines $G_1$ to $G_{2n}$. The gate drivers 400L and 400R may be integrated on the LC panel assembly 300 along with the switching elements Q and the signal lines $G_1$ to $G_{2n}$ and $D_1$ to $D_m$. However, the gate drivers 400L and 400R may include at least one integrated circuit ("IC") chip mounted on the LC panel assembly 300 or on a flexible printed circuit ("FPC") film in a tape carrier package ("TCP") type, which are attached to the LC panel assembly 300.

The data driver 500 is connected to the data lines $D_1$ to $D_m$ of the LC crystal panel assembly 300. The data driver 500 selects the gray voltages from the gray voltage generator 800, and applies the selected gray voltages as data signals to the data lines $D_1$ to $D_m$. The data driver 500 may include a plurality of IC chips mounted on the LC panel assembly 300, or on a FPC film (not shown) in a TCP type, which is attached to the LC panel assembly 300. However, when the gray voltage generator 800 supplies a limited number of gray voltages, but not all of the gray voltages, the data driver 500 divides the gray voltages to generate the data signals.

The signal controller 600 controls the gate drivers 400L and 400R, the data driver 500 and other like components.

As described above, since the pixels PX are arranged such that their long edges are parallel to the row direction, the number of data lines $D_1$ to $D_m$ decreases as compared with a case where the long edges of the pixels PX are parallel to the column direction. Therefore, the number of data driving IC chips can be reduced. Even though the number of gate lines $G_1$ to $G_{2n}$ may increase, the gate drivers 400L and 400R can be integrated into the LC panel assembly 300 and thus the product cost can be reduced. In addition, even when the gate driver 400L and 400R are implemented as IC chips, the gate driving IC chips are less expensive than the data driving IC chips, and thus, the product cost can also be lowered.

The operation of the liquid crystal display will now be described in further detail below.

The signal controller 600 receives input image signals R, G and B and input control signals for controlling display thereof from an external graphics controller (not shown). The input image signals R, G and B include luminance information on the pixels PX. The luminance has a predetermined number of gray levels, for example $1024(=2^{10})$, $256(=2^8)$, or $64(=2^6)$ gray levels. The input control signals may be, for example, a vertical synchronization signal Vsync, a horizontal synchronization signal Hsync, a main clock signal MCLK, a data enable signal DE, and so on.

On the basis of the input control signals and the input image signals R, G and B, the signal controller 600 processes the input image signals R, G and B suitable for the operation condition of the LC panel assembly 300, and generates gate control signals CONT1 and data control signals CONT2. The signal controller 600 sends the gate control signals CONT1 to the gate drivers 400L and 400R, and sends the data control signals CONT2 and the processed image signals DAT to the data driver 500. The image signal processing of the signal controller 600 includes rearrangement of the input image signals R, G and B according to the arrangement of the pixels PX shown in FIG. 1.

The gate control signals CONT1 include a pair of scanning start signals which provide instruction to start scanning, two pairs of (e.g., first to fourth) clock signals which control an output period of a gate-on voltage Von, and a pair of output switching signals which switches the output of the gate-on voltage Von. The gate control signal CONT1 may further include an output enable signal OE which defines the duration of the gate-on voltage Von.

The data control signals CONT2 include a horizontal synchronization start signal STH which informs the start of transmission of digital image signals DAT to a row of pixels PX, a load signal LOAD that instructs to apply analog data signals to the data lines $D_1$ to $D_m$, and a data clock signal HCLK. The data control signals CONT2 may further include an inversion signal RVS that reverses the polarity of the voltages of the analog data signals (e.g., relative to the common voltage Vcom).

Responsive to the data control signals CONT2 from the signal controller 600, the data driver 500 receives a packet of the digital image signals DAT for a row of pixels PX from the signal controller 600, converts the digital image signals DAT into analog data signals selected from the gray voltages, and applies the analog data signals to the data lines $D_1$ to $D_m$.

The gate drivers 400L and 400R apply the gate-on voltage Von to the gate lines $G_1$ to $G_{2n}$ in response to the gate control signals CONT1 from the signal controller 600 to turn on the switching elements Q that are connected to the gate lines $G_1$ to $G_{2n}$. The data signals applied to the data lines $D_1$ to $D_m$ are then applied to the pixels PX through the turned-on switching elements Q.

The difference between the voltage of a data signal and the common voltage Vcom applied to a pixel PX is represented as a voltage across the liquid crystal capacitor Clc of the pixel PX, which is referred to as a pixel voltage. The liquid crystal molecules in the liquid crystal capacitor Clc have orientations depending on a magnitude of the pixel voltage, and the molecular orientations determine the polarization of light passing through the liquid crystal layer 3. The polarizer(s) converts the light polarization into the light transmittance such that the pixel PX has a luminance represented by the gray of an image signal DAT.

This process is repeatedly performed for every one horizontal period, which is also called "1H" and is equal to one period of the horizontal synchronizing signal Hsync and the data enable signal DE. In such a manner, the gate-on voltage Von is sequentially applied to all of the gate lines $G_1$ to $G_{2n}$, and the data signals are applied to all of the pixels PX to display an image for one frame.

If one frame is completed, the next frame starts. The inversion signal RVS applied to the data driver 500 is controlled in order to reverse the polarity of the data signal for every pixel PX (which is referred to as "frame inversion"). The inversion signal RVS may be also controlled such that the polarity of the data signals flowing in one data line may be periodically reversed (for example, row inversion or dot inversion), or the polarities of the data signals in a packet may be reversed (for example, column inversion or dot inversion).

As described above, two adjacent pixels PX in each pixel column are connected to opposing data lines $D_1$-$D_m$. At this time, if the data driver 500 performs the column inversion, two adjacent pixels PX in the column direction, as well as pixels PX in the row direction, have pixel voltages of opposite polarities. That is, a type of apparent inversion appearing on the LC panel assembly 300 becomes dot inversion.

The gate drivers according to the exemplary embodiment of the present invention will now be described in further detail with reference to FIGS. 3 and 4.

Figure 3:
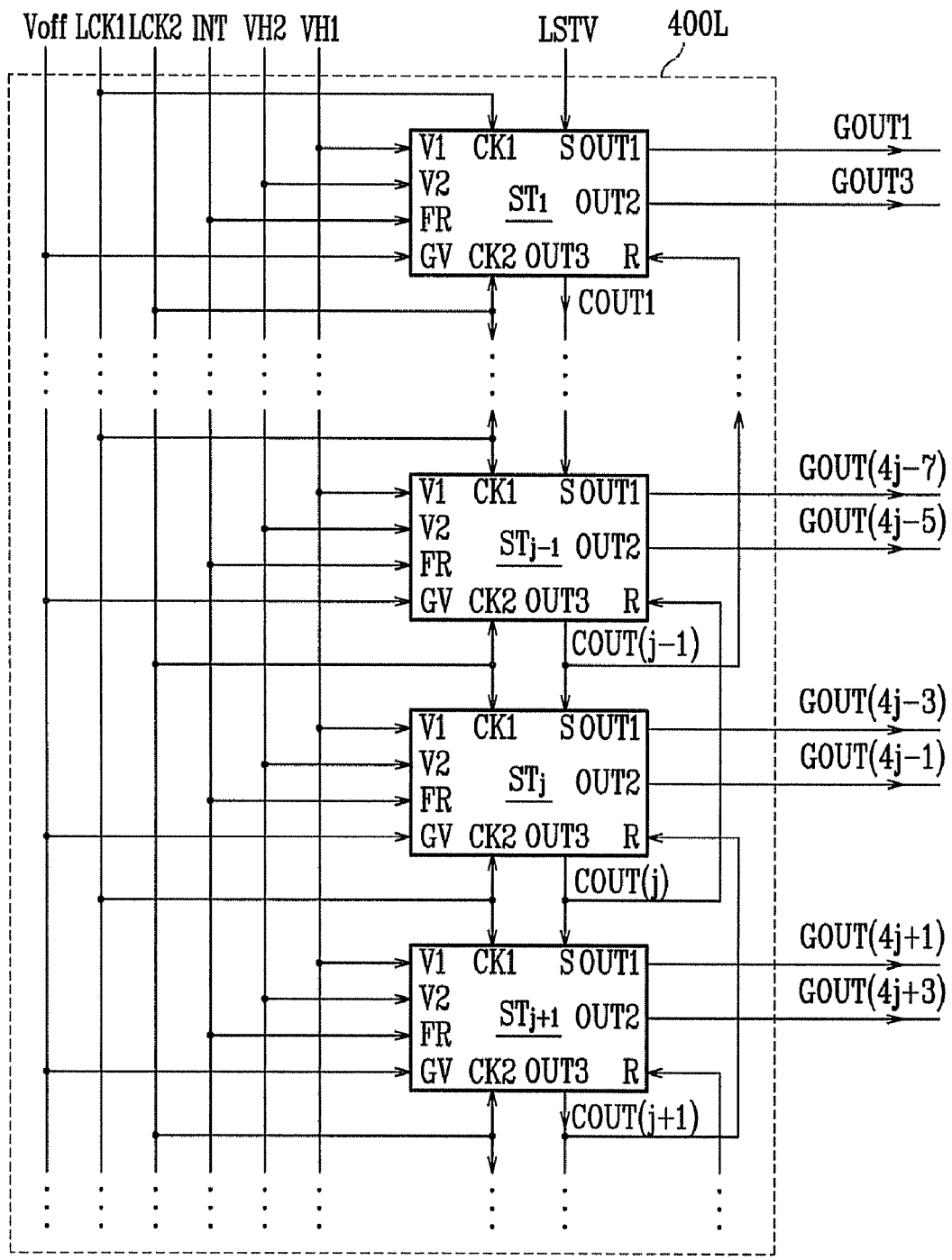
FIG. 3 is a block diagram showing an example of the gate driver shown in FIG. 1.

FIG. 3 is a block diagram showing an exemplary embodiment of the gate driver shown in FIG. 1. FIG. 4 is a circuit schematic diagram showing an example of one stage of the exemplary gate driver shown in FIG. 3.

Figure 4:
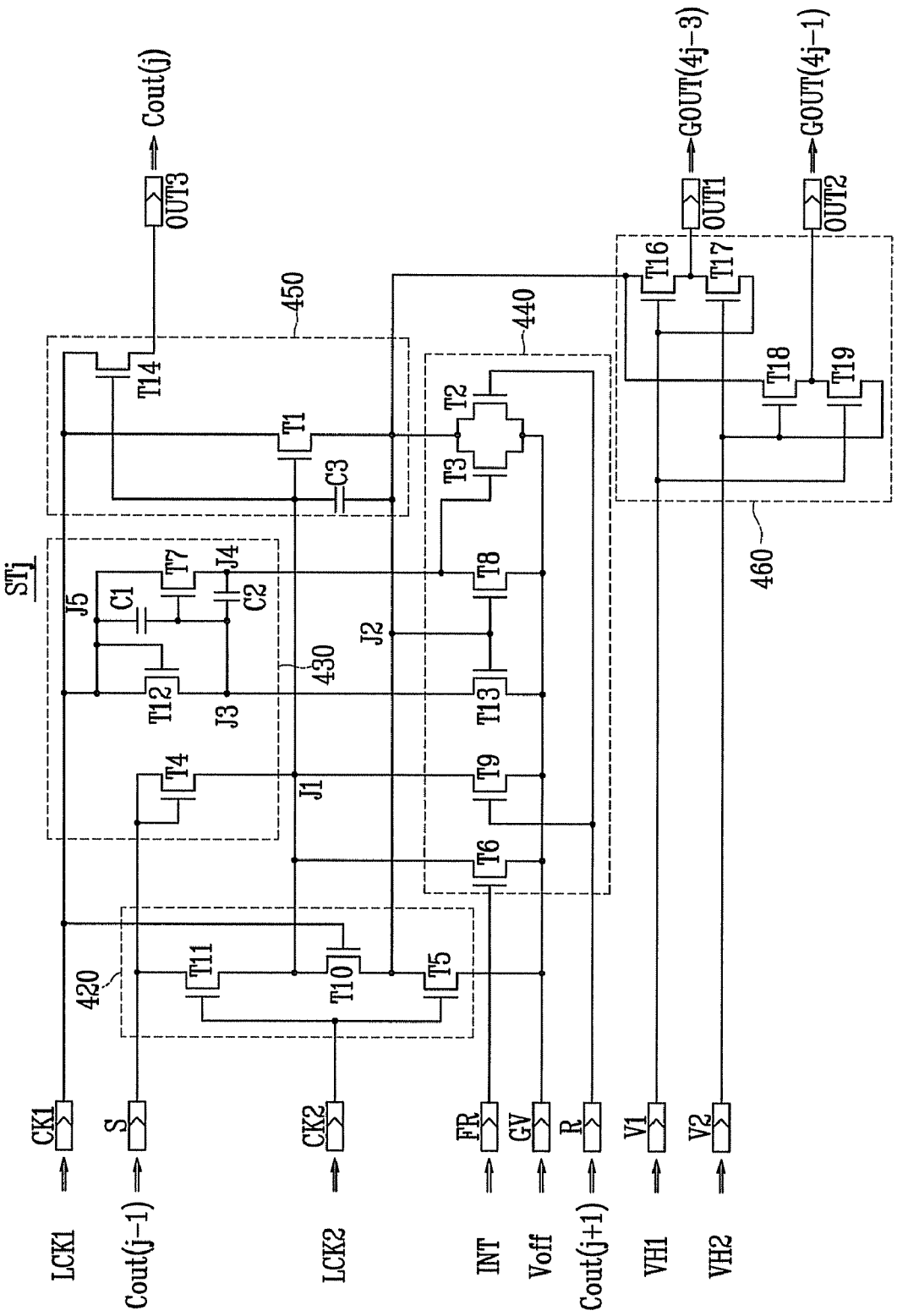
FIG. 4 is a circuit schematic diagram showing an example of one stage shown in FIG.3.

Referring to FIG. 3 and FIG. 4, each of the gate drivers 400L and 400R, for example, the left gate driver 400L includes a plurality of stages $ST_1$, $ST_2$, . . . which are connected to one another in a cascade manner and sequentially output the gate signals. Each of the stages $ST_1$, $ST_2$, . . . receives a gate-off voltage Voff, first and second clock signals LCK1 and LCK2, first and second switching signals VH1 and VH2, and an initialization signal INT. All of the stages $ST_1$, $ST_2$, . . . are respectively connected to the gate lines. However, a dummy stage (not shown), which is not connected to any gate line, may be added at the end of the arrangement of the cascaded stages.

Each of the stages $ST_1$, $ST_2$, . . . has a first clock terminal CK1, a second clock terminal CK2, a set terminal S, a reset terminal R, a gate voltage terminal GV, a frame reset terminal FR, a first switching terminal V1, a second switching terminal V2, first and second gate output terminals OUT1 and OUT2, and a carry output terminal OUT3.

In each of the stages, for example in the j-th stage $ST_j$, the set terminal S receives a carry output of a previous stage $ST_{j-1}$, which is referred to as a previous stage carry output Cout(j−1), and the reset terminal R receives a carry output of a next stage $ST_{j+1}$, which is referred to as a next stage carry output Cout(j+1). The first and second clock terminals CK1 and CK2 receive the clock signals LCK1 and LCK2, the gate voltage terminal GV receives the gate-off voltage Voff, and the frame reset terminal FR receives the initialization signal INT. The first and second switching terminals V1 and V2 receive the first and second switching signals VH1 and VH2, respectively. The first and second gate output terminals OUT1 and OUT2 output the first and second gate outputs Gout(4j−3) and Gout(4j−1), respectively, and the carry output terminal OUT3 outputs a carry output Cout(j). The carry output of the last stage may be provided to each of the other stages as the initialization signal INT.

However, in each of the shift registers 400L and 400R, the first stage $ST_1$ receives a scanning start signal LSTV at the set terminal S instead of a previous stage carry output, and the last stage may receive the scanning start signal LSTV at the reset terminal R instead of a next stage gate output. When the first clock terminal CK1 of the j-th stage $ST_j$ receives the second clock signal LCK2 and the second clock terminal CK2 of the j-th stage $ST_j$ receives the first clock signal LCK1, the first clock terminal CK1 of each of the (j−1)th and (j+1)th stages $ST_{j-1}$ and $ST_{j+1}$, which are adjacent to the j-th stage $ST_j$, receives the first clock signal LCK1, and the second clock terminal CK2 thereof receives the second clock signal LCK2.

The first and second clock signals LCK1 and LCK2 may have a high level voltage equal to the gate-on voltage Von or a low level voltage equal to the gate-off voltage Voff in order to drive the switching elements (or transistors) Q of the pixels PX, respectively. The first and second clock signals LCK1 and LCK2 may each have a duty ratio of 50% and a phase difference of 180°.

In addition, the first and second switching signals VH1 and VH2 may have a high level voltage equal to the gate-on voltage Von or a low level voltage equal to the gate-off voltage Voff in order to drive the transistors Q of the pixels PX, respectively. The first and second switching signals VH1 and VH2 may each have a duty ratio of 50% and a phase difference of 180°. A period of each of the first and second switching signals VH1 and VH2 is one frame.

Referring to FIG. 4, each of the stages of each of the gate drivers 400L and 400R according to the exemplary embodiment of the present invention, for example the j-th stage, includes a voltage generator, which includes an input unit 420, a pull-up driver 430, a pull-down driver 440, an output unit 450, and an output switching unit 460 connected to the output unit 450. Each of the units includes at least one N type field effect transistor ("FET") T1 to T14, and the pull-up driver 430 and the output unit 450 further include capacitors C1 to C3. However, P type FETs may be used instead of the N type FETs in alternative exemplary embodiments. The capacitors C1 to C3 may actually represent parasitic capacitance between the gate and the drain/source of the transistors T1-T14. The voltage generator may have a different structure from the exemplary embodiment illustrated shown in FIG. 4.

The input unit 420 includes three transistors T11, T10 and T5 which are sequentially coupled in series between the set terminal S and the gate voltage terminal GV. Gates of the transistors T11 and T5 are connected to the second clock terminal CK2, and a gate of the transistor T10 is connected to the first clock terminal CK1. A junction between the transistor T11 and the transistor T10 is connected to a junction J1, and a junction between the transistor T10 and the transistor T5 is connected to a junction J2.

The pull-up driver 430 includes three transistors T4, T12 and T7 and two capacitors C1 and C2. The transistor T4 is connected between the set terminal S and the junction J1. The transistor T12 is connected between the first clock terminal CK1 and a junction J3. The transistor T7 is connected between the first clock terminal CK1 and a junction J4. A gate and a drain of the transistor T4 are commonly connected to the set terminal S, and a source thereof is connected to the junction J1. A gate and a drain of the transistor T12 are commonly connected to the first clock terminal CK1, and a source thereof is connected to the junction J3. A gate of the transistor T7 is connected to the junction J3 and to the first clock terminal CK1 through the capacitor C1, a drain thereof is connected to the first clock terminal CK1, and a source thereof is connected to the junction J4. The capacitor C2 is connected between the junction J3 and the junction J4.

The pull-down driver 440 includes a plurality of transistors T6, T9, T13, T8, T3 and T2 which all receive the gate-off voltage Voff through sources thereof and output the gate-off voltage Voff to the junctions J1, J2, J3 and J4 through drains thereof. A gate of the transistor T9 is connected to the reset terminal R and a drain thereof is connected to the junction J1. Gates of the transistors T13 and T8 are commonly connected to the junction J2, and drains thereof are connected to the junctions J3 and J4, respectively. A gate of the transistor T3 is connected to the junction J4, and a gate of the transistor T2 is connected to the reset terminal R. The two transistors T3 and T2 have drains that are connected to the junction J2. A gate of the transistor T6 is connected to the frame reset terminal FR, a drain thereof is connected to the junction J1, and a source thereof is connected to the gate-off voltage terminal GV.

The output unit 450 includes a pair of transistors T1 and T14 and a capacitor C3. A drain and a source of the transistor T1 are connected between the first clock terminal CK1 and the junction J2, and a drain and a source of the transistor T14 are connected between the first clock terminal CK1 and the output terminal OUT 3. Gates of the transistors T1 and T3 are connected to the junction J1. The output unit 450 also has the capacitor C3 connected between the gate and the source of the transistor T1, that is, between the junction J1 and the junction J2. The source of the transistor T1 is also connected to the junction J2.

The output switching unit 460 includes two pairs of pass and cutoff transistors T16 to T19 that are symmetrically connected with respect to the first and second switching signals VH1 and VH2 at the first switching terminal V1 and second switching terminal V2, respectively. The pass transistor T16/T18 has a control terminal receiving the first/second switching signal VH1/VH2, an input terminal receiving the output of the output unit 450, and an output terminal connected to the first/second output terminal OUT1/OUT2 of the stage STj. The cutoff transistor T17/T19 has a control terminal receiving the second/first switching signal VH2/VH1, an input terminal receiving the first/second switching signal VH1/VH2, and an output terminal connected to the first/second output terminal OUT1/OUT2 of the stage STj.

The operation of the stage will now be described in further detail below.

Let us assume low level voltages for the first and second clock signals LCK1 and LCK2 and the first and second switching signals VH1 and VH2 are equal to the gate-off voltage Voff.

First, when the second clock signal LCK2 and the previous stage carry output Cout(j−1) become high, the transistors T11 and T5 and the transistor T4 turn on. The two transistors T11 and T4 transmit the high level voltage to the junction J1, and the transistor T5 transmits the low level voltage to the junction J2. The transistors T1 and T14 then turn on to output the first clock signal LCK1 to the output terminal OUT3. At this time, since the junction J2 and the first clock signal LCK1 have the low level voltage, the output of the output unit 450 is the low level voltage. Simultaneously, the capacitor C3 charges a voltage corresponding to the difference between the high level voltage and the low level voltage.

Here, the first clock signal LCK1 and the next stage carry output Cout(j+1) are low and the voltage of the junction J2 is also low. Therefore, all of the transistors T10, T9, T12, T13, T8 and T2, the gates of which are connected to the junction J2, are in off states.

Next, the second clock signal LCK2 becomes low to turn off the transistors T11 and T5. At this time, since the first clock signal LCK1 becomes high, the output voltage of the transistor T1 and the voltage of the junction J2 become high.

Although the gate of the transistor T10 is supplied with the high level voltage, since the source thereof connected to the junction J2 is also high, a voltage difference between the gate and the source of the transistor T10 vanishes to keep the transistor T10 in the turn off state. Therefore, the junction J1 becomes floating, and the voltage of the junction J1 is raised by an amount of the high level voltage due to the capacitor C3.

Meanwhile, the first clock signal LCK1 and the junction J2 have the high level voltage to turn on the transistors T12, T13 and T8. In this state, the transistor T12 and the transistor T13 are coupled in series between the high level voltage and the low level voltage and thus the transistors T12 and T13 serve as resistors. Therefore, the voltage of the junction J3 has a value determined by the turn-on resistances of the two transistors T12 and T13.

The voltage of the junction J3 is almost equal to the high level voltage if the turn-on resistance of the transistor T13 is very high, for example, about 10,000 times the turn-on resistance of the transistor T12. Therefore, the transistor T7 turns on to be coupled in series with the transistor T8, and thus the voltage of the junction J4 has a value determined by the turn-on resistances of the two transistors T7 and T8. At this time, when the resistances of the two transistors T7 and T8 are almost the same, the voltage of the junction J4 lies between the high level voltage and the low level voltage. Therefore, the transistor T3 keeps its turn-off state.

At this time, since the next stage carry output Cout(j+1) is still low, the transistors T9 and T2 also keep their turn-off states. Accordingly, the output of the output unit 450 is connected only to the first clock signal LCK1 but is disconnected from the low level voltage such that the output unit 450 outputs the high level voltage.

Meanwhile, the capacitor C1 and the capacitor C2 store voltages across them. The voltage of the junction J3 is lower than that of the junction J5.

Next, the next stage carry output Cout(j+1) and the second clock signal LCK2 become high, and the first clock signal LCK1 becomes low, the transistors T9 and T2 turn on to transmit the low level voltage to the junctions J1 and J2. At this time, the voltage of the junction J1 drops to the low level voltage since the capacitor C3 discharges.

It takes time for the voltage of the junction J1 to reach the low level voltage because it also takes time for the capacitor C3 to completely discharge. Therefore, the two transistors T1 and T14 keep their turn-on states for a time after the next stage carry output Cout(j+1) becomes high. Accordingly, the output of the output unit 450 is connected to the first clock signal LCK1 to output the low level voltage. When the capacitor C3 completely discharges to make the voltage of the junction J1 equal to the low level voltage, the transistor T14 turns off to disconnect the output terminal OUT3 from the first clock signal LCK1. The carry output Cout(j) is in a floating state and keeps the low level voltage.

Simultaneously, the other output of the output unit 450, that is, the output that is supplied to the output switching unit 460, keeps outputting the low level voltage because the output terminal OUT1 is connected to the low level voltage through the transistor T2 even though the transistor T1 turns off.

Meanwhile, since the transistors T12 and T13 turn off, the junction J3 becomes floating. The voltage of the junction J5 becomes lower than that of the junction J4. Since the junction J3 keeps the voltage that is lower than that of the junction J5 by the capacitor C1, the transistor T7 turns off. Simultaneously, since the transistor T8 turns off, the voltage of the junction J4 drops as much, and the transistor T3 also keeps the turn-off state. The gate of the transistor T10 is connected to the low level voltage of the first clock signal LCK1, and the voltage of the junction J2 is low, such that the transistor T10 keeps the turn-off state.

Successively, the first clock signal LCK1 becomes high to turn on the transistors T12 and T7 and to raise the voltage of the junction J4. The transistor T3 turns on to transmit the low level voltage to the junction J2 such that the output unit 450 maintains an output at the low level voltage. Therefore, even though the next stage carry output Cout(j+1) is low, the voltage level of the junction J2 can be low.

Meanwhile, since the gate of the transistor T10 is connected to the high level voltage of the first clock signal LCK1, and the voltage of the junction J2 is low, the transistor T10 turns on to transmit the low level voltage of the junction J2 to the junction J1. Since the first clock terminal CK1 is connected to the drains of the two transistors T1 and T14, the first clock signal LCK1 is continuously applied thereto. In particular, the transistor T1 is larger than the other transistors, and thus parasitic capacitance between the gate and the drain thereof is relatively large. Accordingly, a change in the drain voltage of the transistor T1 may interfere with the gate voltage thereof. Therefore, when the first clock. signal LCK1 becomes high, the gate voltage of the transistor T1 may rise due to the parasitic capacitance to turn on the transistor T1. Therefore, by transmitting the low level voltage of the junction J2 to the junction J1, the gate voltage of the transistor T1 keeps the low level voltage to prevent the transistor T1 from turning on.

Thereafter, until the previous stage carry output Cout(j−1) becomes high, the junction J1 keeps the low level voltage. The voltage of the junction J2 becomes low by the transistor T3 when the first clock signal LCK1 is high and the second clock signal LCK2 is low. Otherwise, the junction J2 keeps the low level voltage by the transistor T5.

When the output of the output unit 450 is the high level voltage, when the first switching signal VH1 is high and the second switching signal VH2 is low, the transistor T16 of the output switching unit 460 outputs the output of the output unit 450 and the transistor T17 turns off. In contrast, the transistor T18 turns off and the transistor T19 turns on to output the value of the second switching signal VH2, that is, the low level voltage. Therefore, the output of the first output terminal OUT1 becomes the high level voltage, and the output of the second output terminal OUT2 becomes the low level voltage. Similarly, when the first switching signal VH1 is low and the second switching signal VH2 is high, the output of the first output terminal OUT1 becomes the low level voltage, and the output of the second output terminal OUT2 becomes the high level voltage.

Meanwhile, the transistor T6 receives the initalization signal INT of the carry output Cout(n+1) from the last, dummy stage, transmits the gate-off voltage Voff to the junction J1, and sets the voltage of the junction J1 to the low level voltage again.

In such a manner, the stage $ST_j$ generates the carry signal Cout(j) and the gate signals Gout(4j−3) and GOUT(4j−1) based on the previous stage carry signal Cout(j−1) and the next stage carry signal Cout(j+1) in synchronization with the first and second clock signals LCK1 and LCK2. Also, the first and second switching signals VH1 and VH2 control two outputs of the stage STj to be alternately outputted.

Accordingly, the addition of only the four transistors (e.g., T16-T19) and the two signal lines (e.g., VH1 and VH2) enables the application of the gate-on voltage to the two gate lines, and thus an area of a shift register is reduced.

In this exemplary embodiment, one stage $ST_j$ generates gate-on voltages for two gate lines. However, the stage $ST_j$ may be modified to generate gate-on voltages for three or more gate lines by adding some more transistors and signal lines (e.g., VH3, VH4 . . . ).

In this exemplary embodiment, the gate lines may be sequentially supplied with the gate-on voltage Von. That is, the order of the gate lines supplied with the gat-on voltage Von are a first gate line, a second gate line, a third gate line, a fourth gate line, and so on.

Meanwhile, when the periods of the first and second clock signals LCK1 and LCK2 are one frame, the first half frame has a value different from the second half frame. Therefore, every stage generates an output through the first output terminal for the first half frame, and generates an output through the second output terminal for the second half frame. Therefore, the order of the gate lines supplied with the gate-on voltage Von are a first gate line, a second gate line, a fifth gate line, a sixth gate line, . . . , and a third gate line, a fourth gate line, a seventh gate line, an eighth line, and so on.

According to exemplary embodiments of the present invention, the number of data lines can be reduced and the number of data drivers can also be reduced, thereby reducing manufacturing costs.

While the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A shift register comprising:
   a plurality of stages connected to one another and configured to sequentially generate output signals,
   wherein each of the stages of the plurality of stages has first and second output terminals configured to alternately output a first output voltage, and
   wherein each of the stages comprises:
      an output unit comprising a transistor and a capacitor connected between two terminals of the transistor;
      a pull-up driver charging the capacitor; and
      a pull-down driver discharging the capacitor,
   wherein each of the stages further comprises an output switching unit configured to receive an output of the output unit and output the first output voltage and the second output voltage alternately to the first output terminal and the second output terminal,
   wherein the output switching unit comprises:
      a first transistor configured to switch the output of the output voltage generator according to a first switching signal,
      a second transistor configured to switch the output of the output voltage generator according to a second switching signal,
      a third transistor configured to pass or cut off the second output voltage to the first output terminal according to the second switching signal, and
      a fourth transistor configured to pass or cut off the second output voltage to the second output terminal according to the first switching signal,
      wherein an input terminal of the third transistor is directly connected to a control terminal of the first transistor, and an input terminal of the fourth transistor is directly connected to a control terminal of the second transistor.

2. The shift register of claim 1, wherein each of the stages further comprises an output voltage generator configured to generate the first output voltage and the second output voltage in response to an output start signal or the output signal of one of previous stages and the second output voltage is different from the first output voltage.

3. The shift register of claim 1, wherein the first switching signal and the second switching signal have opposite phases.

4. The shift register of claim 1, wherein the first and second switching signals are reversed every 1H period.

5. A display device comprising:
a substrate;
a plurality of gate lines formed on the substrate;
a plurality of data lines intersecting the gate lines;
a plurality of thin film transistors connected to the gate lines and the data lines;
a plurality of pixel electrodes connected to the thin film transistors and arranged in a matrix, each pixel electrode having a first edge parallel to the gate lines and a second edge shorter than the first edge and disposed adjacent to the first edge and parallel to the data lines; and
a gate driver connected to the gate lines,
wherein the gate driver comprises a plurality of stages coupled to one another and configured to sequentially generate output signals, and
each of the plurality of stages comprises an output unit comprising a transistor and a capacitor connected between two terminals of the transistor;
a pull-up driver charging the capacitor; and
a pull-down driver discharging the capacitor,
wherein each of the stages further comprises an output switching unit configured to receive an output of the output unit and output the first output voltage and the second output voltage alternately to the first output terminal and the second output terminal, wherein the output switching unit comprises:
a first transistor configured to switch the output of the output voltage generator according to a first switching signal,
a second transistor configured to switch the output of the output voltage generator according to a second switching signal,
a third transistor configured to pass or cut off the second output voltage to the first output terminal according to the second switching signal, and
a fourth transistor configured to pass or cut off the second output voltage to the second output terminal according to the first switching signal,
wherein an input terminal of the third transistor is directly connected to a control terminal of the first transistor, and an input terminal of the fourth transistor is directly connected to a control terminal of the second transistor.

6. The display device of claim 5, wherein each of the stages comprises an output voltage generator configured to generate the first output voltage and the second output voltage in response to an output start signal or the output signal of one of the previous stages and the second output voltage is different from the first output voltage.

7. The display device of claim 5, wherein the first switching signal and the second switching signal have opposite phases.

8. The display device of claim 5, wherein the first and second switching signals are reversed every 1H period.

9. The display device of claim 5, wherein two adjacent pixel electrodes in a column are connected to different data lines.

10. The display device of claim 9, wherein the gate driver comprises first and second shift registers connected to different gate lines, and each of the first and second shift registers comprises first and second stages of the plurality of stages.

11. A display device comprising:
a substrate;
a plurality of gate lines formed on the substrate;
a plurality of data lines intersecting the gate lines;
a plurality of thin film transistors connected to the gate lines and the data lines;
a plurality of pixel electrodes connected to the thin film transistors and arranged in a matrix, each pixel electrode having a first edge parallel to the gate lines and a second edge shorter than the first edge and disposed adjacent to the first edge and parallel to the data lines; and
gate drivers connected to the gate lines,
the gate drivers are disposed near left edges and right edges, respectively, of the display device,
wherein the gate drivers comprises a plurality of stages coupled to one another and configured to sequentially generate output signals respectively, and
each of the stages of the plurality of stages comprises an output unit comprising a transistor and a capacitor connected between two terminals of the transistor;
a pull-up driver charging the capacitor; and
a pull-down driver discharging the capacitor,
wherein each of the stages further comprises an output switching unit configured to receive an output of the output unit and output the first output voltage and the second output voltage alternately to the first output terminal and the second output terminal,
wherein the output switching unit comprises:
a first transistor configured to switch the output of the output voltage generator according to a first switching signal,
a second transistor configured to switch the output of the output voltage generator according to a second switching signal,
a third transistor configured to pass or cut off the second output voltage to the first output terminal according to the second switching signal, and
a fourth transistor configured to pass or cut off the second output voltage to the second output terminal according to the first switching signal,
wherein an input terminal of the third transistor is directly connected to a control terminal of the first transistor, and an input terminal of the fourth transistor is directly connected to a control terminal of the second transistor.

12. The display device of claim 11, wherein each of the stages comprises an output voltage generator configured to generate the first output voltage and the second output voltage in response to an output start signal or the output signal of one of the previous stages and the second output voltage is different from the first output voltage.

13. The display device of claim 11, wherein the first switching signal and the second switching signal have opposite phases.

14. The display device of claim 11, wherein the first and second switching signals are reversed every 1H period.

15. The display device of claim 11, wherein two adjacent pixel electrodes in a column are connected to different data lines.

* * * * *